(12) United States Patent
Smith et al.

(10) Patent No.: US 8,049,408 B2
(45) Date of Patent: Nov. 1, 2011

(54) LIGHT EMISSIVE DEVICE HAVING ELECTRODE COMPRISING A METAL AND A MATERIAL WHICH IS CODEPOSITABLE WITH THE METAL

(75) Inventors: Euan C. Smith, Cambridge (GB); Matthew Roberts, Cambridge (GB); William Young, Cambridge (GB); Clare Louise Foden, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 950 days.

(21) Appl. No.: 11/659,930

(22) PCT Filed: Aug. 10, 2005

(86) PCT No.: PCT/GB2005/003135
§ 371 (c)(1),
(2), (4) Date: Aug. 28, 2007

(87) PCT Pub. No.: WO2006/016153
PCT Pub. Date: Feb. 16, 2006

(65) Prior Publication Data
US 2008/0265751 A1 Oct. 30, 2008

(30) Foreign Application Priority Data

Aug. 10, 2004 (GB) .................................. 0417794.5
Dec. 24, 2004 (GB) .................................. 0428404.8
May 31, 2005 (GB) .................................. 0511057.2

(51) Int. Cl.
*H01J 1/62* (2006.01)
*H01J 63/04* (2006.01)

(52) U.S. Cl. ...................... 313/504; 427/66; 204/192.12; 313/483; 313/498; 313/499; 313/500; 313/501; 313/502; 313/503; 313/505; 313/506

(58) Field of Classification Search .................. None
See application file for complete search history.

(56) References Cited

U.S. PATENT DOCUMENTS
4,539,507 A 9/1985 VanSlyke et al.
(Continued)

FOREIGN PATENT DOCUMENTS
EP 0 901 176 A2 3/1999
(Continued)

OTHER PUBLICATIONS

Gu et al., "Transparent Organic Light Emitting Devices," *Appl. Phys. Lett.*, 68(19):2606-2608 (1996).
(Continued)

*Primary Examiner* — Natalie Walford
(74) *Attorney, Agent, or Firm* — Marshall, Gerstein & Borun LLP

(57) ABSTRACT

An organic light emissive device comprising: a first electrode; a second electrode; and an organic light emissive region between the first and second electrodes comprising an organic light emissive material which has a peak emission wavelength, wherein at least one of the electrodes is transparent and comprises a composite of a charge injecting metal and another material which is codepositable with the charge injecting metal, the other material having a different refractive index to that of the charge injecting metal and wherein the other material has a lower degree of quenching at the peak emission wavelength than the charge injecting metal whereby quenching of excitons by the at least one electrode is reduced, the charge injecting metal comprising either a low work function metal having a work function of no more than 3.5 eV or a high work function metal having a work function of no less than 4.5 eV.

63 Claims, 4 Drawing Sheets

U.S. PATENT DOCUMENTS

| | | | |
|---|---|---|---|
| 5,314,759 A * | 5/1994 | Harkonen et al. | 428/690 |
| 5,677,572 A | 10/1997 | Hung et al. | |
| 5,723,873 A | 3/1998 | Yang | |
| 5,798,170 A | 8/1998 | Zhang et al. | |
| 6,191,433 B1 | 2/2001 | Roitman et al. | |
| 6,278,236 B1 | 8/2001 | Madathil et al. | |
| 6,559,598 B2 * | 5/2003 | Justel et al. | 313/587 |
| 6,771,018 B2 * | 8/2004 | Toguchi et al. | 313/498 |
| 6,970,490 B2 * | 11/2005 | Holmes et al. | 372/43.01 |
| 2001/0051284 A1 | 12/2001 | Ueda et al. | |
| 2003/0042848 A1 * | 3/2003 | Park et al. | 313/503 |
| 2003/0116765 A1 | 6/2003 | Koo et al. | |
| 2003/0117071 A1 * | 6/2003 | Lee et al. | 313/512 |
| 2004/0150352 A1 * | 8/2004 | Koide et al. | 315/169.3 |
| 2004/0251459 A1 * | 12/2004 | Cina | 257/40 |
| 2005/0127831 A1 * | 6/2005 | Takeuchi et al. | 313/506 |
| 2005/0196969 A1 * | 9/2005 | Gunner et al. | 438/725 |
| 2005/0274944 A1 * | 12/2005 | Jang et al. | 257/40 |
| 2006/0043887 A1 * | 3/2006 | Patwardhan et al. | 313/506 |
| 2006/0152152 A1 * | 7/2006 | Kim et al. | 313/506 |

FOREIGN PATENT DOCUMENTS

| | | |
|---|---|---|
| EP | 1 122 800 A2 | 8/2001 |
| JP | 6-188074 | 7/1994 |
| JP | 11-329746 | 11/1999 |
| JP | 2003-59672 A | 2/2003 |
| WO | WO-90/13148 A1 | 11/1990 |
| WO | WO-98/05187 A1 | 2/1998 |
| WO | WO-99/21935 A1 | 5/1999 |
| WO | WO-00/35028 A1 | 6/2000 |
| WO | WO-00/46321 A1 | 8/2000 |
| WO | WO-00/55927 A1 | 9/2000 |
| WO | WO-00/57446 A1 | 9/2000 |
| WO | WO-01/19142 A1 | 3/2001 |
| WO | WO-01/49768 A2 | 7/2001 |
| WO | WO-01/81649 A1 | 11/2001 |
| WO | WO-02/066552 A1 | 8/2002 |
| WO | WO-03/019696 A2 | 3/2003 |
| WO | WO-03/095586 A1 | 11/2003 |

OTHER PUBLICATIONS

Han et al., "Al:SiO Thin Films for Organic Light-emitting Diodes," *J. Appl. Phys.*, 96(1):709-714 (2004).

Hobson et al., "Surface Plasmon Mediated Emission from Organic Light-emitting Diodes," *Adv. Mater.*, 14(9):1393-1396 (2002).

Hung et al., "Enhanced Electron Injection in Organic Electroluminescence Devices Using an Al/LiF Electrode," *Appl. Phys. Lett.*, 70(2):152-154 (1997).

Jabbour et al., "Aluminum Based Cathode Structure for Enhanced Electron Injection in Electroluminscent Organic Devices," *Appl. Phys. Lett.*, 73(9):1185-1187 (1998).

Kobayashi et al., "A Novel RGB Multicolor Light-emitting Polymer Display," *Synth. Met.*, 111-112:125-128 (2000).

Lai et al., "Application of Ytterbium in Organic Light-emitting Devices as High Performance and Transparent Electrodes," *Chem. Phys. Lett.*, 366(1-2):128-133 (2002).

Smith et al., "Light Outcoupling Efficiency of Top-emitting Organic Light-emitting Diodes," *Appl. Phys. Lett.*, 84(16):2986-2988 (2004).

Tang et al., "Electroluminescence of Doped Organic Thin Films," *J. Appl. Phys.*, 65(9):3610-3616 (1989).

Wedge et al., "Coupled Surface Plasmon-polariton Mediated Photoluminescence From a Top-emitting Organic Light-emitting Structure," *Appl. Phys. Lett.*, 85(2):182-184 (2004).

Yang et al., "Efficient Polymer Light Emitting Diodes with Metal Fluoride/Al Cathodes," *Appl. Phys. Lett.*, 79(5):563-565 (2001).

Combined Search Report for Application No. GB0417794.5, dated Dec. 3, 2004.

International Preliminary Report on Patentability for International Application No. PCT/GB2005/003135, dated Feb. 13, 2007.

International Search Report for International Application No. PCT/GB2005/003135, dated Dec. 1, 2005.

Written Opinion for International Application No. PCT/GB2005/003135, dated Dec. 1, 2005.

\* cited by examiner

LIGHT EMISSIVE DEVICE HAVING ELECTRODE COMPRISING A METAL AND A MATERIAL WHICH IS CODEPOSITABLE WITH THE METAL

BACKGROUND OF THE INVENTION

1. Field of the Invention

The invention relates to organic light emissive devices, to methods of making such devices and the use of cathodes therein.

2. Related Technology

Organic light emissive devices (OLEDs) generally comprise a cathode, an anode and an organic light emissive region between the cathode and the anode. Light emissive organic materials may comprise small molecular materials such as described in U.S. Pat. No. 4,539,507 or polymeric materials such as those described in PCT/WO90/13148. The cathode injects electrons into the light emissive region and the anode injects holes. The electrons and holes combine to generate photons.

FIG. 1 shows a typical cross-sectional structure of an OLED. The OLED is typically fabricated on a glass or plastics substrate 1 coated with a transparent anode 2 such as an indium-tin-oxide (ITO) layer. The ITO coated substrate is covered with at least a layer of a thin film of an electroluminescent organic material 3 and cathode material 4 of low workfunction metal such as calcium is applied, optionally with a capping layer of aluminum (not shown). Other layers may be added to the device, for example to improve charge transport between the electrodes and the electroluminescent material.

There has been a growing interest in the use of OLEDs in display applications because of their potential advantages over conventional displays. OLEDs have relatively low operating voltage and power consumption and can be easily processed to produce large area displays. On a practical level, there is a need to produce OLEDs which are bright and operate efficiently but which are also reliable to produce and stable in use.

The structure of the cathode in OLEDs is one aspect under consideration in this art. In the case of a monochrome OLED, the cathode may be selected for optimal performance with the single electroluminescent organic material. However, a full colour OLED comprises red, green and blue light organic emissive materials. Such a device requires a cathode capable of injecting electrons into all three emissive materials, i.e. a "common electrode".

It is known that a layer of metal fluoride located between the organic emissive layer (or organic electron transporting layer, if present) and the metal cathode can result in an improvement in device efficiency—see for example Appl. Phys. Lett. 70, 152, 1997. This improvement is believed to result from a reduction in the barrier height at the polymer/cathode interface, allowing improved electron injection into the organic layer(s). A mechanism of device degradation using the LiF/Al cathode is proposed in Appl. Phys. Lett. 79(5), 563-565, 2001 wherein LiF and Al may react to release Li atoms that can migrate into the electroluminescent layer and dope the electroluminescent material. However, the present inventors have found the LiF/Al cathode to be relatively stable, its main drawback being relatively low efficiency (in particular when used as a common cathode). A more efficient arrangement utilises a bilayer of calcium and aluminum over LiF in place of aluminum alone, which is described as a common cathode in Synth. Metals 2000, 111-112, p. 125-128, however this is a less stable system due to greater liberation of metal as compared to the LiF/Al cathode. In particular, it is reported in WO 03/019696 that degradation is particularly marked for devices comprising this cathode and electroluminescent materials comprising sulfur such as the red emitting polymer comprising the trimer repeat unit thiophene-benzothiadiazole-thiophene.

According to WO00/35028 WO 00/35028, a light emissive device is provided which includes a light absorbent layer comprising graphite and/or a fluoride or oxide of a low work function metal such as lithium. According to this arrangement, the cathode may be formed of lithium fluoride optionally codeposited with aluminum for use as an electron-injecting layer which is light absorbent. Aluminum has a relatively high workfunction. U.S. Pat. No. 6,278,236 also provides a multilayer organic electroluminescent device with an electron-injecting layer. In this arrangement the electron-injecting layer includes aluminum and at least one alkali metal halide or at least one alkaline earth metal halide. A composite electron injection layer comprising lithium fluoride and aluminum is exemplified. Other high work function cathode materials such as gold are suggested. Another composite cathode is described in Jabbour et al in Applied Physics Letters 73 (9), 1185-1187 (1998). Aiming to avoid the use of low work function metals to avoid unreliability, a composite cathode is described comprising lithium fluoride or caesium fluoride and aluminum. US 2001/0051284A also describes a composite electron injection layer in a multilayer organic electroluminescence device. The electron-injection layer preferably comprises low work function metal oxides or metal halides such as those of lithium, magnesium and yttrium. Metals having a relatively high work function are mixed in the electron-injection layer, preferably aluminum, indium, silver or gold, each of which has a work function in excess of 4.2 eV. Indium and aluminum are the metals disclosed in the Examples.

GENERAL DESCRIPTION OF THE INVENTION

The invention provides an organic light emissive device with improved properties, including a cathode with improved electron injection into the organic light emissive region, and also provides a cathode capable of injecting electrons into a variety of different types of organic light emissive materials, i.e. a "common electrode," so that electron-injection into red, green and blue light organic emissive materials can be effected with a single cathode.

In certain device applications it is necessary for the cathode to be transparent. This is particularly the case where drive circuitry or other structures are situated adjacent to the anode thereby preventing light emission through the anode. These devices are frequently termed "top emitting devices". FIG. 2 shows in diagrammatic form a typical cross-sectional structure of a top emitting OLED. An anode material 22 such as ITO may be situated on a metal mirror 25 which is positioned over an active matrix back plane 21. Hole transporting material 26 is situated between the anode 22 and an emissive layer 23. Optionally, a further intermediate layer 27 may be applied between the electron-injection layer and the light emitting layer.

The cathode layer 24 is situated over the light emitting layer 23 and is generally a layer of barium, which is a low work function metal so as to be able to inject electrons into the emissive layer. A buffer layer 28 is deposited over the barium cathode layer 24 and an indium tin oxide (ITO) layer 29 is deposited over the buffer layer to provide a relatively transparent layer of lateral conductivity to compensate for the relatively low conductivity of the barium cathode. Finally, a transparent encapsulation layer (not shown) is applied over the ITO layer so as to protect the device from ingress of oxygen and moisture.

A problem arises with the fabrication of the cathode of this arrangement. ITO is depositable only by sputtering. However, sputtering is a highly damaging process and if the ITO were sputtered directly onto an unprotected barium cathode, the cathode and light emitting layer would be damaged. It is for this reason that the buffer layer is used. The buffer layer must not interfere with electron-injection but may make some contribution to the optical properties of the device, if required. Buffer materials may be metals. However, in order to achieve the buffering protection required, a relatively high thickness of metal would need to be used and this may have adverse effects on the transparency of the cathode. Common buffers therefore tend to be highly transparent compounds such as barium fluoride or zinc sulfide. These buffer materials, however, suffer from a disadvantage that they are poor conductors.

An article in the Journal of Applied Physics 96(1), 709-714 (2004) acknowledges that sputter damage is a problem in the fabrication of top emitting organic light emitting devices. The authors suggest that Al doped SiO thin films, which can be deposited by thermal evaporation, provide an attractive alternative method of laying down a transparent cathode for a top emitting OLED. The authors conclude that a multilayer stack of LiF/Al/Al:SiO may be applicable as a cathode in which the fraction of Al in the films is a key parameter to optimise the electrical conductivity, electron-injection and optical transparency of the cathode. The cathode structures described all therefore require a layer of LiF/Al to provide adequate electron-injection. A relatively high level of aluminum is required to provide adequate conductivity which has the undesirable effect of reducing the transparency of the cathode.

An article in Chemical Physics Letters 366 (2002) 128-133 discloses that Ytterbium can be used to prepare a transparent cathode by co-evaporating Yb and Ag to form a Yb:Ag alloy electrode. This article also refers to a paper in Applied Physics Letters 68 (1996) 2606 which discloses a transparent OLED which uses a very thin Mg:Ag alloy layer capped by a sputter-deposited ITO film. It is stated that since the work function of Yb (2.6 eV) is lower than those of Li dissociated from LiF (2.9 eV), Mg:Ag (3.68 eV) and Ag (4.2 eV), the energy barrier for electron injection between the organic light emitting layer and the cathode is lower using Yb. However, Yb is very expensive. Furthermore, lower current density and luminance were obtained when the cathode is thin. This is because as the Yb:Ag cathode layer becomes thinner, the current density decreases as a result of the lower conductance of the thinner cathode layer. However, the luminance only rises slightly compared with the more significant increase in current density on increasing the thickness of the layer and this is attributed to more reflection/absorption caused by the thicker Yb:Ag layer. A large proportion of light is lost by total internal reflection as Ag has low transparency.

The invention provides an organic light emissive device with improved properties, including a cathode which does not suffer from the drawbacks of cathode structures of the prior art.

Another problem known in the art is loss of efficiency in organic light emissive devices that arises due to quenching of excitons by quenching modes associated with the metallic cathodes almost invariably used to inject electrons into the light-emitting layer. Quenching modes occur in two forms: Surface Plasmon (SP) modes and Lossy modes. Surface Plasmon modes result from the coupling between the free charges at the surface of a metal and electromagnetic radiation. This interaction leads to longitudinal surface charge density fluctuations that propagate along the surface of the metal combined with an oscillating EM field that decays exponentially away from the metallic surface. Surface Plasmon modes propagate a relatively long distance along the surface of the metal in contrast to Lossy modes which propagate only a relatively short distance.

Several possible solutions to this problem have been suggested in the art. In "L. H. Smith et el., Light outcoupling efficiency of top-emitting organic light-emitting diodes, Appl. Phys. Lett. 84 (16), 2986-2988" it is disclosed that the position of the excitons within the organic layer changes the strength of the coupling to SP modes, and thus the optical efficiency of the device. Accordingly, it is suggested in this document that the layer geometry (e.g. thickness of the organic layer) may be optimized such that the excitons are situated at their optimum location. However, this approach is problematic as accurately positioning the excitons within a device is difficult and changing the geometry of the device can lead to other problems such as an increase in resistivity and a fall in transparency.

It is also suggested in "L. H. Smith et al., Light outcoupling efficiency of top-emitting organic light-emitting diodes, Appl. Phys. Lett. 84 (16), 2986-2988" that coupling to SP modes is less problematic in devices which utilize a light emitting polymer rather than a small molecule emissive materials due to the fact that the excitons in a polymer are oriented in the plane of the layer and are thus poorly matched to the SP field whereas the excitons in a small molecule device are randomly oriented. However, the present applicant has found that significant quenching by SP modes occurs in polymer devices.

In "S. Wedge et al., Coupled surface plasmon-polariton mediated photoluminescence from a top-emitting organic light-emitting structure, Appl. Phys. Lett. 85 (2), 182-184" the problem of losses to the SP modes associated with metallic cathodes is also disclosed and possible methods for recovering some of the power lost to these SPs are discussed. It is disclosed that one method of coupling SP modes to light is to introduce a periodic microstructure into the metal film, allowing the SPs to Bragg scatter. However, it is stated that such an approach is demanding in terms of fabrication. An alternative is disclosed in which a microstructured dielectric overlayer is superimposed onto the cathode. However, this also increases the complexity of the fabrication process and the addition of an extra layer reduces the transparency of the cathode. Furthermore, the present applicant has found that the short Lossy modes are not accessed by such microstructures.

In "P. Hobson et al., Surface Plasmon Mediated Emission from Organic Light-Emitting Diodes, Adv. Mater. 14 (19), 1393-1396" it is also suggested that coupling to SP modes is less problematic in devices which utilize a light emitting polymer rather than a small molecule emissive materials due to the fact that the excitons in a polymer are oriented in the plane of the layer as a result of the spin casting process used in the fabrication process. However, as stated previously the present applicant has found that significant quenching by SP modes still occurs in polymer devices. For example, the polymers will not be as oriented if they are deposited by ink jet printing rather than spin casting. The authors of this prior art document suggest introducing a periodic microstructure through the device layers to recover power lost to the SP modes. Again, this increases the complexity of the fabrication process. Furthermore, the present applicant has found that the Lossy modes are not accessed by such microstructures.

The present invention provides an organic light emissive device with improved properties, including a transparent electrode with a low level of quenching by both SP and Lossy modes.

In a first aspect, the invention provides an organic light emissive device comprising a cathode; an anode; and an organic light emissive region between the cathode and the anode, wherein the cathode comprises an electron-injection layer comprising a composite of a metal compound, which is an alkali metal or alkaline earth metal halide or oxide, and a low work function metal having a work function of no more than 3.5 eV.

It has surprisingly been found that an electron-injection layer comprising the composite of an alkali metal or alkaline earth metal halide or oxide and a low work function metal can inject electrons efficiently into the organic light emissive region in a way which is sufficiently stable and reliable for practical use.

The low workfunction metal of the electron-injection layer is preferably an alkaline earth metal. Of the alkaline earth metals, magnesium and beryllium have workfunctions which are too high for use in the present invention. Radium is not a preferred choice being impractical to use on account of its radioactive half life. Calcium and barium are preferred as the low work function metal. The low workfunction metal has a work function of no more than 3.5 eV, preferably no more than 3.2 eV and more preferably no more than 3 eV. The low workfunction metal may have a workfunction as low as 2 eV, however its workfunction is most preferably in the range 2.5-3 eV.

The metal compound of the electron-injection layer is an alkali metal or alkaline earth metal halide or oxide. The metal of this metal compound is typically sodium, potassium, caesium, rubidium, or barium or calcium, with lithium being preferred. Of these compounds, lithium fluoride is particularly preferred.

The ratio of low workfunction metal:metal compound is typically up to 10:1 (e.g. in the range 1:1 to 10:1), preferably up to 5:1 (e.g. in the range 1:1 to 5:5), more preferably up to 3:1 (e.g. in the range 1:1 to 3:1) by volume as measured during deposition using a quartz crystal thickness sensor. A range of from 2:1 to 3:1 is preferred. The combination of metal compound and low workfunction metal, and their ratio, together provide an electron-injection layer which is straightforward and reliable to produce and which is relatively stable in operation. The electron-injection layer is relatively efficient at injecting electrons into organic light emissive layers due to the combined effect of the low workfunction metal and the electron injecting properties of the metal compound and is widely-tolerated by organic light emissive layers. The co-deposited electron-injection layers of the present invention do not suffer from the drawbacks of conventional bilayer electron-injection layers such as LiF/Ca because there is a smaller quantity of metal compound in direct contact with the electroluminescent layer. The energy levels of the electron-injection layers are also well-matched to use for electron-injection into green and blue light emissive layers.

Because the electron-injection layer of the present invention is capable of injecting electrons into red, green and blue light emitting materials, the cathode of the present invention may be used as a "common cathode" in an organic light emissive device. According to this aspect of the invention there is provided an organic light emissive device in which the organic light emissive region comprises discrete sub-pixels of red, green and blue light emitting materials. The cathode injects electrons into each sub-pixel. In this way there is no need for separate cathodes to inject electrons into each sub-pixel separately. This greatly simplifies construction of multicolour organic light emissive devices. The construction of multicolour and full colour displays with a common cathode will be apparent to the skilled person. For example, an inkjet printed full colour display is disclosed in Synth. Metals 2000, 111-112, p. 125-128.

The electron-injection layer typically has a thickness in the range of from 1 to 100 nm, preferably 2 to 10 nm. In some arrangements the cathode is required to be transparent and so materials and thicknesses must be selected accordingly. In other arrangements the anode may be transparent. Where the OLED needs to emit light to an observer will depend upon the application to which it is put. The electron-injection layer may be applied by any conventional method, including codeposition or coevaporation of the components thereof.

Typically, the cathode further comprises a capping layer for protecting the electron-injection layer from environmental reactants such as oxygen, water and other reactive materials. It is frequently advantageous for the capping layer also to be electrically conductive so that it may be connected to a power supply. Conventional capping layers comprise high workfunction metals and alloys thereof or oxides of certain metals. Aluminum is a material preferred for the encapsulant layer. The capping layer may have a thickness in the range 50-1000 nm.

The anode may be constructed of any suitable material and typically has a workfunction greater than 4.3 eV, usually around 4.8 eV. Conventional anode materials include tin oxide, high workfunction metals such as gold or platinum and indium tin oxide (ITO). Indium tin oxide is preferred.

The organic light emissive region may comprise any suitable organic light emitting material such as an electroluminescent polymer, an electroluminescent dendrimer, an electroluminescent small molecule, or any combination thereof which is electroluminescent. The organic light emitting material is typically applied or formed as a layer thereof.

Small molecule electroluminescent materials include 8-hydroxy quinoline aluminum (alq3 as described in U.S. Pat. No. 4,539,507). These materials are typically deposited as an organic thin film in OLEDs. Other small molecule emitters may be deposited in a host material which is usually polymeric, as part of a host-dopant system as disclosed in, for example, J. Appl. Phys. 1989, 65(9), 3610-3616.

Electroluminescent polymers include those described in PCT/WO90/13148 such as polyarylene vinylenes, including poly(para-phenylene vinylene) (PPV). Other materials include poly(2-methoxy-5(2'-ethyl)hexyloxyphenylene-vinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9,9-di-n-octylfluorene) ("F8"), poly(2,7-(9,9-di-n-octylfluorene)-(1,4-phenylene-((4-secbutylphenyl)imino)-1,4-phenylene)) ("F8-TFB"), poly(2,7-(9,9-di-n-octylfluorene)-(1,4-phenylene-((4-methylphenyl)imino)-1,4-phenylene-((4-methylphenyl)imino)-1,4-phenylene)) ("F8-PFM"), poly(2,7-(9,9-di-n-octylfluorene)-(1,4-phenylene-((4-methoxyphenyl)imino)-1,4-phenylene-((4-methoxyphenyl)imino)-1,4-phenylene)) ("F8-PFMO"), or (2,7-(9,9-di-n-octylfluorene)-3,6-Benzothiadiazole) ("F8BT").

Methods of forming layers of these polymers in OLEDs are well known in this art.

Electroluminescent dendrimers are also known for use in organic emissive layers in OLEDs. Such dendrimers preferably have the formula:

$$\text{CORE–[DENDRITE]}_n$$

in which CORE represents a metal cation or a group containing a metal ion, n represents an integer of 1 or more, each DENDRITE, which may be the same or different represents an inherently at least partially conjugated dendritic structure comprising aryl and/or heteroaryl groups or nitrogen and, optionally, vinyl or acetylenyl groups connected via sp or sp hybridised carbon atoms of said (hetero)aryl vinyl and acetylenyl groups or via single bonds between N and (hetero)aryl groups, CORE terminating in the single bond which is connected to an sp hybridised (ring) carbon atom of the first (hetero)aryl group or single bond to nitrogen to which more than one at least partly conjugated dendritic branch is attached, said ring carbon or nitrogen atom forming part of said DENDRITE.

Emission is typically provided by the dendrimer core; emission may be fluorescent as disclosed in WO 99/21935 or phosphorescent as disclosed in WO 02/066552.

Optionally the organic light emissive device may include a hole transporting layer between the anode and the organic light emissive region. Such a layer may assist hole injection from the anode into the emissive region. Examples of organic hole injection materials include PEDT/PSS as disclosed in EP0901176 and EP0947123, or polyarylene as disclosed in U.S. Pat. No. 5,723,873 and U.S. Pat. No. 5,798,170. PEDT/PSS is polystyrene sulphonic acid doped polyethylene dioxythiophene. Other hole transporting materials include PPV and poly(2,7-(9,9-di-n-oxtylfluorene)-(1,4-phenylene-(4-imino(benzoic acid))-1,4-phenylene-(4-imino(benzoic acid))-1,4-phenylene)) (BFA) and polyaniline.

In another aspect, the invention provides an organic light emissive device comprising a cathode; an anode; and an organic light emissive region between the cathode and the anode, wherein the cathode comprises a transparent composite of a low work function metal having a work function of no more than 3.5 eV and a transparent material codepositable with the low work function metal.

In accordance with the invention, it has been found that the prior art cathode configuration having a separate buffer layer and cathode material can be replaced by a single layer comprising a composite of a low workfunction metal and a transparent material which may act as a buffer material. In this way, the need for a separate buffer layer is avoided. This simplifies the construction of OLEDs giving the potential to reduce manufacturing costs. The invention is particularly applicable to top emitting devices where the use of a transparent cathode is essential.

The low workfunction metal of the composite is preferably an alkali metal or an alkaline earth metal. Of the alkaline earth metals, magnesium and beryllium have workfunctions which are too high for use in the present invention. Radium is not a preferred choice being impractical to use on account of its radioactive half life. Calcium and barium are preferred as the low work function metal with barium being particularly preferred. Of the alkali metals, lithium is preferred. The low workfunction metal has a work function of no more than 3.5 eV, preferably no more than 3.2 eV and more preferably no more than 3 eV. The low workfunction metal may have a workfunction as low as 2 eV, however its workfunction is most preferably in the range 2.5-3 eV. Under certain conditions, the low work function metal may be provided as a low workfunction metal compound or alloy which provides a source of low work function metal in the composite.

The transparent material must be codepositable with the low workfunction metal. Generally, this requires the transparent material to be capable of being coevaporated with the low workfunction metal. The transparent material may comprise a transparent metal compound, a compound of an element from Group IV of the periodic table, or a dielectric compound. The metal of the metal compound may be a metal from any of Groups I, II and III of the periodic table or a transition metal. It is preferred that the metal of the compound is barium. Such a compound may be a halide, oxide, sulfide, nitride or oxynitride, preferably a fluoride. Useful compounds include, barium fluoride, calcium fluoride, lithium fluoride, aluminum nitride, gallium nitride, lithium oxide, aluminum oxide, tin oxide, silicon oxide, zinc sulfide, silicon nitride and silicon oxynitride.

Depending on the transparency of the composite, this preferably has a thickness of 5 nm to 200 nm, more preferably from 10 nm to 100 nm, and most preferably from 20 nm to 50 nm. The more transparent the composite, the greater the thickness may be. The transparency of the composite depends on the thickness and the composition thereof, particularly the transparency of the low workfunction metal component and the transparency of the transparent material. Additionally, physical or chemical interactions between the components of the composite may have an effect on its transparency. Preferably, the transparency of the composite in the device is at least 60%, more preferably at least 70%, still more preferably at least 80%, and most preferably at least 90%. The transparent buffer material typically has a transparency of at least 70%, preferably at least 80%, more preferably at least 90%, and most preferably at least 95% (when measured at 50 nm thickness).

It is particularly preferred that the transparency ranges set out above are met across all of the visible wavelength, typically 400 to 700 nm.

The volume ratio of low workfunction metal:transparent buffer material is preferably in the range of from 5 to 80 more preferably from 10 to 60.

In one embodiment of the invention, the volume ratio of the low workfunction metal to transparent buffer material decreases across the thickness of the cathode in a direction away from the emissive region. In this embodiment, it is possible to arrange the codeposition of the low workfunction metal and transparent buffer material so that, initially, the composite applied to the emissive region has a very high concentration of low workfunction metal (and may even start with no buffer material). The ratio of the components may be varied with time so that at the end of the process of deposition the composite is predominantly (or exclusively) transparent buffer material. This can be readily achieved by programming the deposition apparatus accordingly. Variation in the ratio of the composite components throughout the thickness of the composite layer has an advantage that high concentration of buffer material may be present at the surface where a conductive transparent layer such as ITO is to be sputtered. In accordance with this embodiment, a smooth variation of the ratio of composite components across the thickness of the cathode is possible.

Where the organic light emissive device comprises a top-emitting device, little or no light emission would be expected or desired through the anode. In one arrangement, the anode is provided on a substrate comprising a metal mirror typically configured to reflect light emitted from the emissive layer out of the device through the cathode. An active matrix back plane may be provided at the other side of the substrate.

Because the composite of the invention is capable of injecting electrons into red, green and blue light emitting materials, the cathode may be used as a "common cathode" in an organic light emissive device. According to this aspect of the invention there is provided an organic light emissive device in which the organic light emissive region comprises discrete sub-pixels of red, green and blue light emitting materials. The cathode injects electrons into each sub-pixel. In this way there is no need for separate cathodes to inject electrons into each sub-pixel separately. This greatly simplifies construction of multicolour organic light emissive devices. The construction of multicolour and full colour displays with a common cathode will be apparent to the skilled person. For example, an inkjet printed full colour display is disclosed in Synth. Metals 2000, 111-112, p. 125-128.

Generally, the cathode further comprises a transparent conductive layer in electrical contact with the side of the composite furthest from the emissive region. The purpose of the transparent conductive layer is to provide lateral conductivity across the cathode. The transparent conductive layer typically has a thickness of from 10 nm to 100 nm and a transparency of at least 80%, preferably at least 90%. A preferred transparent conductive layer is a layer of transparent conductive oxide, particularly ITO.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A better material for absorption of any atmospheric moisture and/or oxygen that may permeate through the substrate or encapsulant may be disposed between the substrate and the encapsulant.

In a further aspect, the invention provides a process for the manufacture of an organic light emissive device as defined above, comprising: providing a portion of the device, which portion comprises an anode and an organic light emissive region; and codepositing (i) a low workfunction metal having a work function of no more than 3.5 eV and (ii) a transparent material to form a transparent composite on the organic light emissive region.

Where a transparent conductive layer such as a transparent conductive oxide like ITO is applied to the composite by sputtering, the composite has buffer properties to protect the cathode and underlying layers from damage.

According to another aspect, the invention provides an organic light emissive device comprising: a first electrode; a second electrode; and an organic light emissive region between the first and second electrodes comprising an organic light emissive material which has a peak emission wavelength, wherein at least one of the electrodes is transparent and comprises a composite of a charge injecting metal and another material which is codepositable with the charge injecting metal, the other material having a different refractive index to that of the charge injecting metal and wherein the other material has a lower degree of quenching at the peak emission wavelength than the charge injecting metal whereby quenching of excitons by the at least one electrode is reduced, the charge injecting metal comprising either a low work function metal having a work function of no more than 3.5 eV or a high work function metal having a work function of no less than 4.5 eV.

According to one embodiment, the invention provides an organic light emissive device comprising: an anode; a cathode; and an organic light emissive region between the anode and cathode comprising an organic light emissive material which has a peak emission wavelength, wherein the cathode is transparent and comprises a composite of a low work function metal having a work function of no more than 3.5 eV and another material which is codepositable with the low work function metal, the other material having a different refractive index to that of the low work function metal and wherein the other material has a lower degree of quenching at the peak emission wavelength than the low work function metal whereby quenching of excitons by the cathode is reduced.

According to another embodiment, the invention provides an organic light emissive device comprising: an anode; a cathode; and an organic light emissive region between the anode and cathode comprising an organic light emissive material which has a peak emission wavelength, wherein the anode is transparent and comprises a composite of a high work function metal having a work function of no less than 4.5 eV and another material which is codepositable with the high work function metal, the other material having a different refractive index to that of the high work function metal wherein the other material has a lower degree of quenching at the peak emission wavelength than the high work function metal whereby quenching of excitons by the anode is reduced.

As the amount of quenching associated with a transparent metal electrode is dependent on the refractive index of the metal, then it would be advantageous to select a metal for use in a transparent electrode which has a refractive index such that quenching is reduced. However, the materials of the electrodes are primarily selected for their electrical properties and in particular their ability to inject electrons (cathode) or holes (anode) into the organic light emitting layer. Accordingly, while replacing these electrode materials may reduce quenching, the electrical properties of the device will be detrimentally affected. Accordingly, rather than merely replacing the metal materials which are best for charge injection, according to the present invention these materials are retained but are provided in a composite with another material selected such that the refractive index of the composite results in a low degree of quenching. The invention thus provides transparent electrodes which have good charge injection properties as well as good out-coupling of light.

The invention reduces quenching while avoiding the need for a change in device geometry to relocate the excitons as suggested in L. H. Smith et al. Furthermore, the invention reduces quenching without the need for periodic microstructures such as those disclosed in Wedge et al. and Hobson et al. The invention reduces quenching by both Lossy and SP modes. This is achieved by preventing these modes from being accessed by changing the optical properties of the material used in the electrode. This contrasts with the prior art arrangements in which these modes are accessed but are subsequently couple back to light emissive modes by a microstructure. Such a microstructure is not suitable for coupling short Lossy modes to light emissive modes.

The optical properties of emission wavelength, refractive index and ability to support quenching modes are material properties rather than functional effects. Thus, materials for constructing an organic light emissive device may be selected according to their optical properties in order to provide embodiments of the present invention. A method for selecting a suitable organic light emissive material, charge injecting metal and other material for reducing quenching is given below.

The particular materials utilized in the transparent electrodes of embodiments of invention will be dependent on the particular organic emitter used as the coupling of excitons to quenching modes is wavelength dependent. As stated in Hobson et al. (see lines 4 to 7, left hand column of page 1394), suitable models to calculate the degree to which emission from radiative excitons is lost to quenching modes are well established. Using such models, the amount of quenching for a particular emission wavelength can be calculated and plotted against the real component of the refractive index (n) and the complex component of the refractive index (k) (an example of such a plot is shown in FIG. 5). By superimposing the refractive index of suitable electrode materials onto the plot it is then straightforward to select a charge injecting metal and another material for reduce coupling to quenching modes of the injecting metal. In particular, the other material, should have a lower degree of quenching than the charge injecting metal and thus be lower down in the contour plot compared with the charge injecting metal. Thus, for example, calcium is a good charge injecting metal but is near the quenching peak in the plot shown in FIG. 5. Accordingly, aluminum may be selected as the other material in the composite so as to reduce quenching as it is far from the quenching peak.

In embodiments of the present invention the particular materials selected for the transparent electrode are not sensitive to the distance of the emissive dipole from the electrode. While the absolute values of quenching vary with distance from the electrode, the relative degree of quenching by different materials is insensitive to the distance of the emissive dipole.

Although some composite electrode layers are disclosed in the prior art, they do not comprise materials having suitable refractive indices for reducing quenching. For example, the Mg:Ag alloy disclosed in the prior art utilizes Mg as an electron injecting material and Ag for its conductive properties. However, as shown in FIG. 5, Ag will actually increase quenching by Mg. Furthermore, the injecting properties of Mg are not particularly good anyway due to the rather high work function of the material.

The effect of co-depositing another material with a different refractive index is to shift the optical properties of the charge injecting metal (low work function metal for cathodes; high work function metal for anodes). Ideally, the metal and the other material should be deposited such that they are intimately mixed in the composite. If the composite is patchy in nature such that it contains pockets of the charge injecting metal then quenching may occur due to these pockets supporting quenching modes. The metal and the other material may be evenly mixed throughout the composite. Alternatively, the concentration of the metal and the other material may be varied though the composite in which case the composite should have a concentration gradient of charge injecting metal and/or other material which is smooth such that the optical properties of the composite are due to the bulk properties of the composite.

The percentage of charge injecting material in the composite of embodiments of the present invention is also important. If the percentage is too high then the bulk properties of the composite will not be sufficiently removed from the properties of the injecting metal and quenching modes will be supported. Conversely, if the percentage of charge injecting metal is too low then charge injection will be detrimentally affected. In this regard, it is to be noted that typical charge injecting layers of 5 nm thickness utilized in known transparent cathodes are not injection limited. That is, reducing the amount of charge injecting material does not immediately lead to a reduction in charge injection. Accordingly, alloying these materials will not necessarily result in a decrease in effective charge injection. However, if the amount of charge injecting metal is overly reduced then charge injection will begin to decrease as the amount of charge injecting metal becomes injection limiting.

The material used in the composite to reduce quenching may be a dielectric compound. For dielectric materials $k=0$ and the materials thus lie along the bottom axis of the plot shown in FIG. 5. Advantageously, the dielectric compound is a transparent material of the type described previously. However, one problem with co-depositing a compound with a metal is that the compound may react with the metal, for example, by transfer of oxygen if an oxide of a metal having a lower reactivity than the injecting metal is utilized. Accordingly, if a compound is used, it is advantageous that the compound is of a metal which is more reactive that the metal used for charge injection.

Alternatively, a metal material may be utilized as the other material which is co-deposited with the metal charge injecting material to form an alloy.

Although the invention is applicable to both anodes and cathodes, embodiments will primarily be utilized for transparent cathodes as metal materials are proven to be good electron injecting materials. In contrast, good non-metallic transparent anode materials such as ITO already exist for which the problem of quenching modes does not apply (only metallic materials exhibit these quenching modes).

The electrodes may comprise further layers in combination with the composite charge injecting layer described above. For example, an additional conductive capping layer may be provided to form a bi-layer. Preferably, this capping layer is of a high work function material which is of low reactivity so as to increase the stability of the electrode leading to longer lifetimes of the device. For example, aluminum, silver or ITO may be used. In such bi-layer structures, far-field optical effects such as reflection are dominated by the thicker capping layer and near-field optical effects such as quenching are dominated by the thin charge injecting layer.

A buffer layer may be provided between the conductive capping layer and the composite injecting layer to form a tri-layer structure. A buffer layer can protect underlying layers when depositing the conductive capping layer by a high energy process such as sputtering (e.g. sputtering ITO). It is to be noted however, that while additional layers may improve the physical/electrical properties of the electrode, the transparency of the electrode will be reduced. Furthermore, additional metallic layers result in further metallic interfaces which could support quenching modes. In one advantageous embodiment of the present invention, the other material utilized in the composite is sufficiently transparent such that it can be provided to a thickness suitable for acting as a buffer layer thus avoiding the need for an additional buffer layer.

As an alternative to the provision of discrete multilayers, in another arrangement the concentration of the charge injecting metal and the other material in the composite may be varied. For example, the co-deposition process may be controlled so as to have a higher concentration of charge injection material at a side of the composite nearest the light-emitting layer and a higher concentration of the other material at a side of the composite farthest away from the light-emitting layer. This is particularly advantageous if the other material is highly conductive as no additional capping layer will be needed to improve the electrical properties of the electrode. Furthermore, with such an arrangement the interface between the top surface of the composite layer and the capping layer is removed thus avoiding possible quenching modes at this interface.

Grading interfaces between material layers reduces optical quenching of light emission in metal containing multi-layer electrode structures positioned close to an emitting layer. Surface plasmon modes, which typically exist at metal/dielectric interfaces contribute to non-radiative recombination (quenching) of emissive dipoles located sufficiently close to these interfaces. Further, lossy modes, which exist to a lesser degree both away from surface plasmon resonances at metal/dielectric interfaces and at metal/metal interfaces, contribute to optical losses. Such quenching effects are enhanced where the optical field at these interfaces is stronger, for example in top emitting devices where light must propagate through a multilayer cathode structure which will include metal layers. Grading of such interfaces can significantly reduce the strength of these surface plasmon and lossy modes.

For example, for a top emitting device with the structure: glass/metal anode/organic layers/Ba/Ag/capping layers and encapsulation, surface plasmon modes, and similar lossy modes, occur at the organic/Ba, Ba/Ag, and Ag/capping interfaces. These can all add to quenching effects within the device. Grading, for example, the Ba/Ag cathode interface will substantially reduce, or remove, quenching due to this interface.

For transparent cathodes, preferably the composite layer comprises Ba or Ca alloyed with Al, Ag, Mg or Cr. Yb is not preferred as it is expensive and may be unstable within the device due to its very low work function leading to poor device lifetimes.

According to another aspect of the present invention there is provided a process for the manufacture of an organic light emissive device as defined above, comprising: (a) providing the at least one electrode by codepositing (i) a low workfunction metal having a work function of no more than 3.5 eV or a high workfunction metal having a work function of no less than 4.5 eV and (ii) a material having a different refractive index to that of the metal for reducing quenching of excitons by modes associated with the metal to form a transparent composite.

BRIEF DESCRIPTION OF THE DRAWINGS

The invention will now be described in further detail, by way of example only, with reference to the accompanying drawings in which.

DETAILED DESCRIPTION

Examples

Example 1

Figure 1:
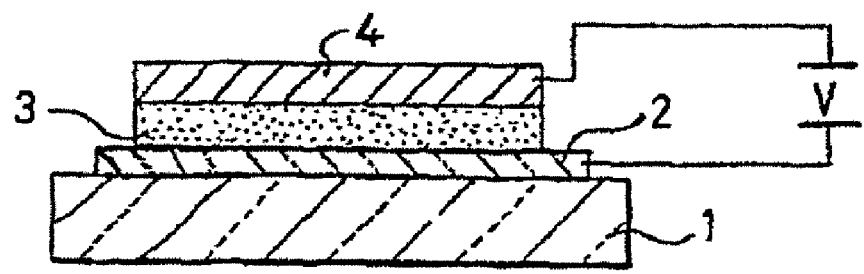
FIG. 1 shows in diagrammatic form a typical cross-sectional structure of an OLED.
Figure 2:
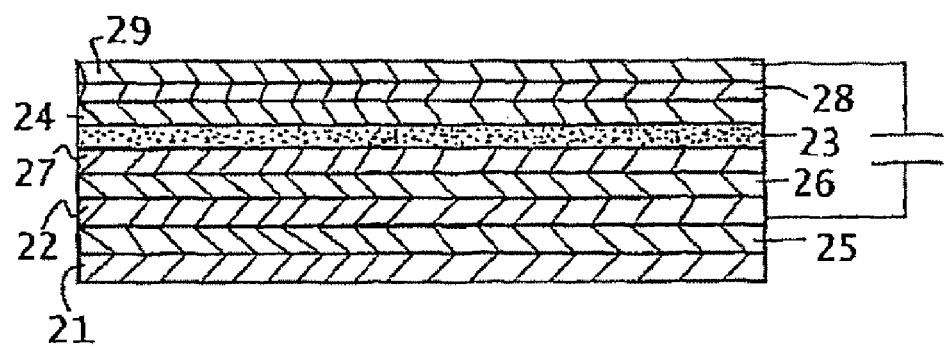
FIG. 2 shows in diagrammatic form a typical cross-sectional structure of a top emitting OLED.
Figure 3:
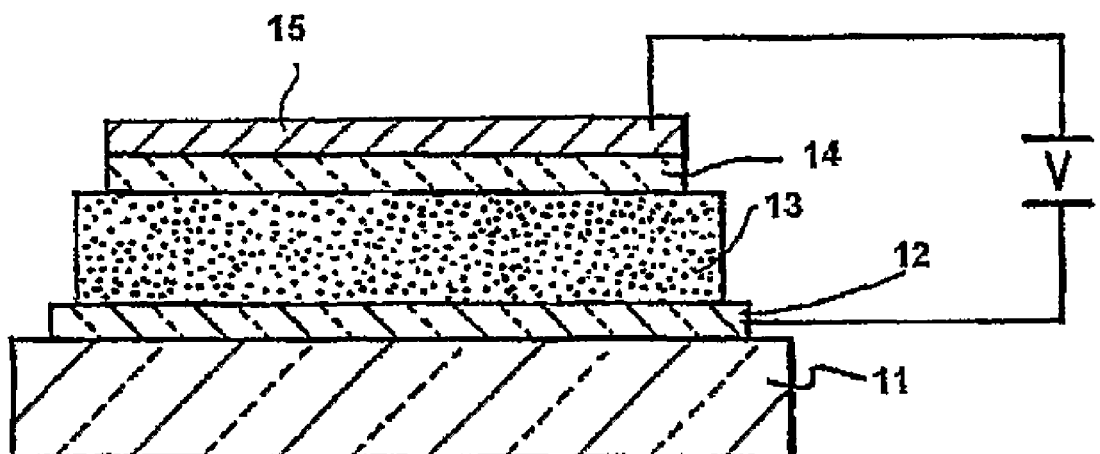
FIG. 3 shows a cross-sectional structure of an OLED according to one aspect of the invention.

Referring to FIG. 3, a layer of PEDT/PSS (not shown) is deposited by spin-coating the formulation Baytron P® available from HC Starck of Leverkusen, Germany onto an indium tin oxide anode 12 supported on a glass substrate 11 (available from Applied Films, Colorado, USA). The PEDT/PSS layer is covered with a layer of a thin film of electroluminescent organic material 13. The organic material is a red-emissive co-polymer comprising repeat units of 9,9-dioctylfluoren-2,7-diyl; 2,1,3-benzothiadiazol-4,7-diyl; and 4,7-bis(2-thien-5-yl)-2,1,3-benzothiadiazole as disclosed in WO 01/49768. A composite layer 14 of BaF and Ca or Ba is co-deposited by electron beam co-evaporation, thermal co-evaporation or co-sputtering on organic layer 13. Capping layer 15 of aluminum is applied by electron beam evaporation, thermal evaporation or sputtering. Finally, the device is encapsulated using a metal enclosure available from Saes Getters SpA (not shown) that is glued to the substrate in order to form an airtight seal.

Example 2

The process described above was followed except that a full colour display was formed according to the process described in EP 0880303 by forming wells for red, green and blue subpixels using standard lithographical techniques; inkjet printing PEDT/PSS into each subpixel well; and inkjet printing red, green and blue electroluminescent materials into wells for red, green and blue subpixels respectively.

Devices according to the invention provide both good electron injection into the organic layer(s) of the OLED due to the presence of both the low workfunction metal and electron injecting metal compound, and at the same time provides increased stability as compared to a bilayer of the low workfunction metal/metal compound as a result of the metal compound being bound in a matrix of the metal, and consequently being less prone to migration into the organic layers of the device.

Example 3

Figure 4:
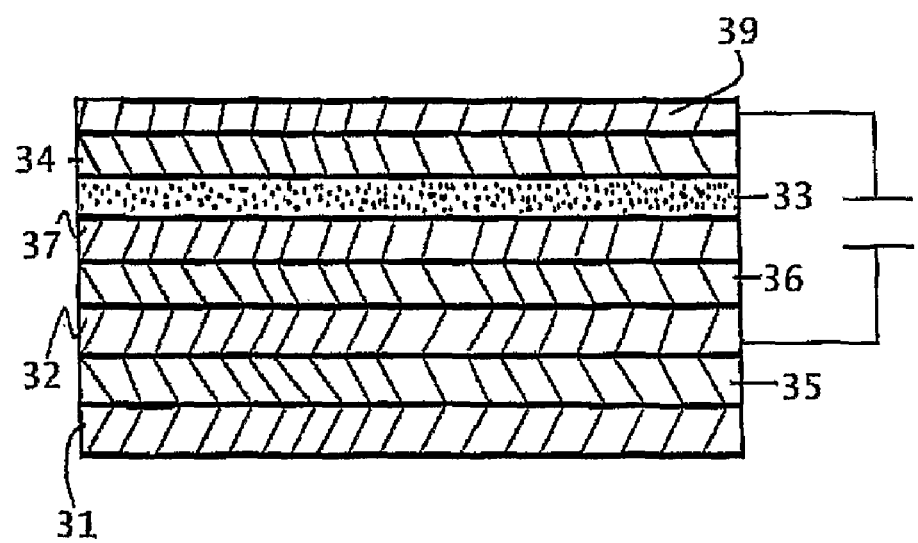
FIG. 4 shows in diagrammatic form a cross-sectional structure of an OLED according to another aspect of the invention.

FIG. 4 shows in diagrammatic form a cross-sectional structure of a top emitting OLED according to the present invention. An anode material 32 such as ITO may be situated on a metal mirror 35 which is positioned over an active matrix back plane 31. Hole transporting material 36 is PEDT/PSS and is situated between anode 32 (ITO) and emissive layer 33. Optionally, a further intermediate layer 37 may be applied between the electron-injecting layer and the light emitting layer.

Composite combined cathode/buffer layer 34 is deposited over the light emitting layer 33 by electron beam coevaporation or thermal coevaporation. An indium tin oxide layer 39 is deposited by sputtering over the composite layer. Finally, a transparent encapsulation layer (not shown) is applied over the ITO layer so as to protect the device from ingress of oxygen and moisture. The encapsulation layer is generally a dielectric or polymer-dielectric composition.

Transparency Measurement

According to a first measurement technique, the composite is deposited onto a cleaned 0.7 mm blank glass substrate by co-evaporation. Following evaporation, the substrate is transferred to a glove box associated with the evaporation apparatus to avoid any exposure of the oxygen and moisture-sensitive Ba metal to the atmosphere.

Transparency of the composite on glass is measured in the glove box using a He—Ne 635 nm laser diode and silicon photodiode detector. Transparency of the blank glass is also measured and transparency of the composite alone is calculated as a ratio by dividing the transparency of the composite on glass by the transparency of the blank glass.

According to a second measurement technique, the first measurement technique is followed except that a layer of silicon oxide is evaporated over the composite in order to further minimise any exposure of the composite to oxygen or moisture, and transparency of a layer of silicon oxide on glass is measured instead of transparency of blank glass for the purpose of the ratio calculation.

Device Fabrication

Blue Device

Poly(ethylene dioxythiophene)/poly(styrene sulfonate) (PEDT/PSS), available from HC Starck of Leverkusen, Germany as Baytron P® is deposited over an indium tin oxide anode supported on a glass substrate (available from Applied Films, Colorado, USA) by spin coating. A hole transporting layer of F8-TFB (shown below) is deposited over the PEDT/PSS layer by spin coating from xylene solution to a thickness of about 10 nm and heated at 180° C. for 1 hour. A blue electroluminescent polymer as disclosed in WO 03/095586 is deposited over the layer of F8-TFB by spin-coating from xylene solution to form an electroluminescent layer having a thickness of around 65 nm. A 30 nm thick composite layer of 50:50 Ba:$BaF_2$ is formed over the electroluminescent layer by coevaporation of Ba and $BaF_2$ at the same rate until the desired thickness is reached (for example, co-evaporation may cut off when a preset volume of either Ba or $BaF_2$ has been deposited). A 50 nm thick layer of ITO is formed over the composite layer by sputtering. Finally, the device is sealed from the atmosphere by placing a glass plate over the device such that the device is located within a cavity formed within the centre of the glass plate and gluing the glass plate to the substrate.

"F8-TFB"

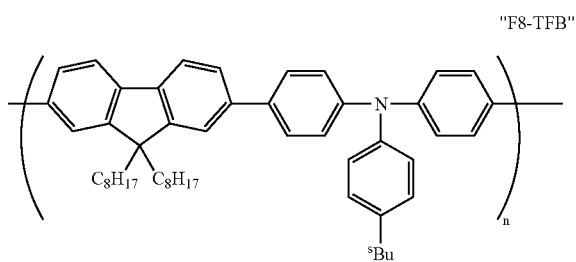

In order to maximise light output through the cathode, a reflective layer may also be provided on the substrate.

Red Device

Devices may be prepared in accordance with the process for the blue device, except that the electroluminescent layer is formed from a red electroluminescent polymer comprising 50 mol % 9,9-di-n-octylfluorene-2,7-diyl, 17 mol % "TFB" repeat units (illustrated below), 30 mol % 1,3,2-benzothiadiazole-4,7-diyl, and 3 mol % 4,7-bis(2-thiophen-5-yl)-1,3,2-benzothiadiazole. Materials of this type are disclosed in WO 00/46321 and WO 00/55927.

"TFB"

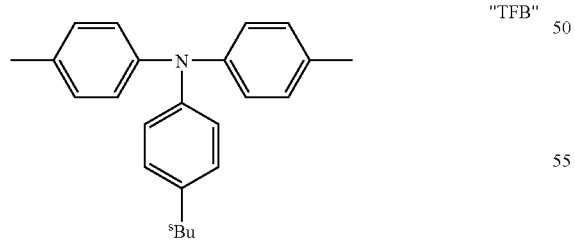

Green Electroluminescent Device

Devices may be prepared in accordance with the process for the blue device, except that the electroluminescent layer is formed from a green electroluminescent polymer as disclosed in, for example, WO 00/55927 and WO 00/46321.

Full Colour Device

A full colour device may be prepared according to the method for the blue device except that the PEDT/PSS and F8-TFB layers are deposited by inkjet printing into inkjet wells formed by photolithography defining red, green and blue subpixel areas followed by inkjet printing the aforementioned red, green and blue electroluminescent polymers According to the invention, the amount of low workfunction metal required to produce the cathode may be less than hitherto required, leading to greater transparency and at the same time increasing the thickness of the cathode layer. This allows greater control for manufacturing. The buffer properties of the composite cathode make it easier to use sputter deposition of the ITO transparent conducting layer. In addition, the buffer material may be chosen to reduce the rate of oxidation of the low workfunction metal leading to a reduction in damage to oxygen/moisture-sensitive regions of the device.

Example 4

Low SP Quenching Cathodes

The blue emitting device according to Example 3 has a cathode with a low degree of quenching due to the presence of $BaF_2$ in the composite layer. This may be seen by reference to FIG. 5 which shows that Barium produces very high dipole (exciton) quenching. In contrast, $BaF_2$ is a dielectric and thus has a K value of zero lying along the lower axis of the plot in FIG. 5. As such, the composite material has a dipole quenching value lying intermediate between that of $BaF_2$ and Ba resulting in a decrease in dipole quenching compared to a cathode utilizing Ba alone as the electron injecting layer.

Figure 5:
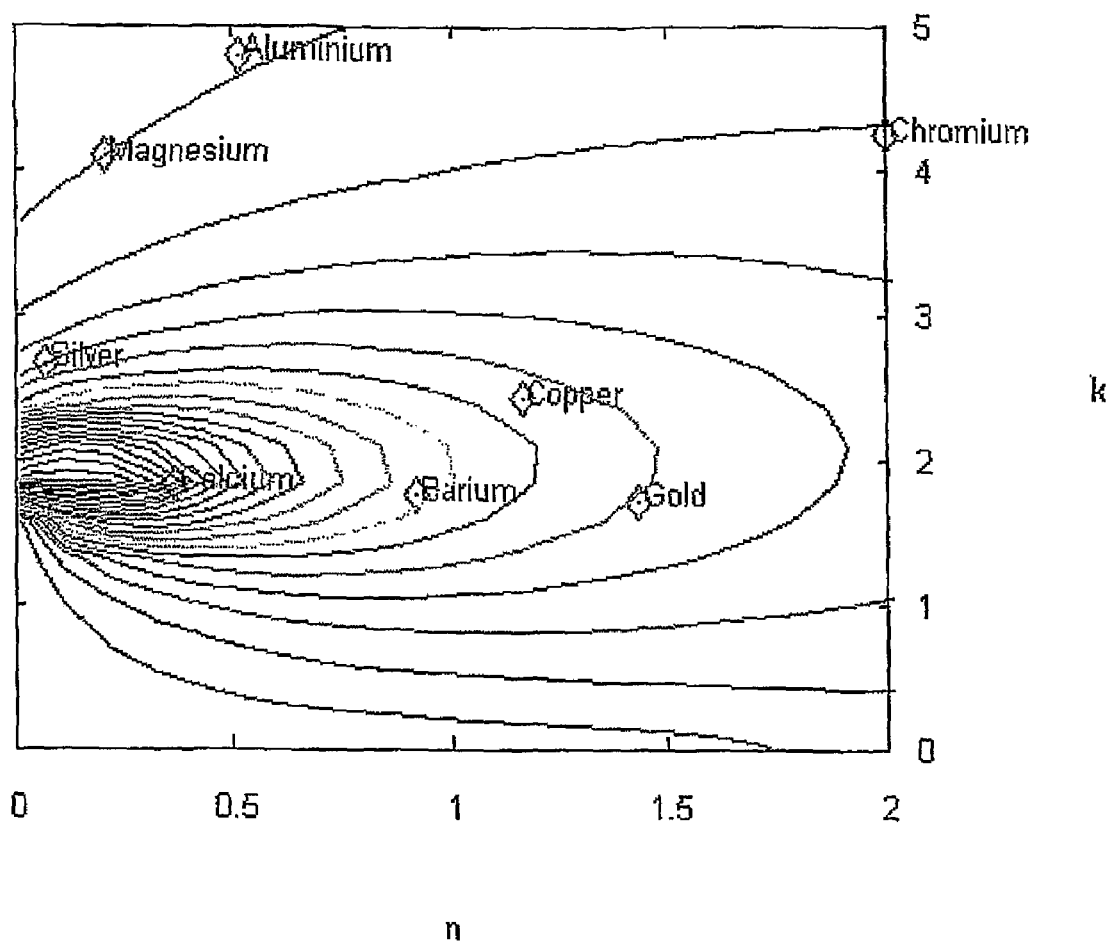
FIG. 5 shows a contour plot indicating variations in the amount of quenching at 460 nm with varying real and complex refractive index of the cathode for dipoles positioned 40 nm therefrom.

As can be seen from FIG. 5, Ba and Ca, which are two of the metals typically used as electron injecting materials, both produce very strong dipole quenching in the near field while Al, Ag, Mg and Cr produce lower dipole coupling. Accordingly, as an alternative to the Ba:$BaF_2$ composite, an alloy of Ba or Ca with Al, Ag, Mg or Cr may be utilized. For example, in one arrangement a 5 nm thick layer of 50:50 Ba:Al is formed over the electroluminescent layer by coevaporation of Ba and Al at the same rate until the desired thickness is reached (for example, co-evaporation may cut off when a preset volume of either Ba or Al has been deposited). A 10 nm thick layer of Ag is formed over the composite layer.

The invention claimed is:
1. An organic light emissive device comprising:
a first electrode;
a second electrode; and
an organic light emissive region between the first and second electrodes comprising an organic light emissive material which has a peak emission wavelength, wherein at least one of the electrodes is transparent and comprises a composite of a charge injecting metal and another material which is codepositable with the charge injecting metal, the other material having a different refractive index to that of the charge injecting metal and wherein the other material has a lower degree of quenching at the peak emission wavelength than the charge injecting metal whereby quenching of excitons by the at least one electrode is reduced, the charge injecting metal comprising either a low work function metal having a work function of no more than 3.5 eV or a high work function metal having a work function of no less than 4.5 eV, wherein the volume ratio of charge injecting metal to other material decreases across the thickness of the at least one electrode in a direction away from the emissive region.

2. An organic light emissive device according to claim 1, wherein the low work function metal is an alkaline earth metal.

3. An organic light emissive device according to claim 2, wherein the alkaline earth metal is calcium or barium.

4. An organic light emissive device according to claim 1, wherein the low work function metal is an alkali metal.

5. An organic light emissive device according to claim 4, wherein the alkali metal is lithium.

6. An organic light emissive device according to claim 1, wherein the other material is a compound.

7. An organic light emissive device according to claim 6, wherein the compound is a transparent material comprising a metal compound or a Group IV compound.

8. An organic light emissive device according to claim 7, wherein the compound is a halide, oxide, sulfide, nitride, or oxynitride.

9. An organic light emissive device according to claim 8, wherein the metal compound is a fluoride.

10. An organic light emissive device according to claim 7, wherein the metal compound comprises barium.

11. An organic light emissive device according to claim 10, wherein the composite has a thickness in the range of from 50 nm to 200 nm.

12. An organic light emissive device according claim 1, wherein the other material is a metal.

13. An organic light emissive device according to claim 12, wherein said metal is at least one member of the group consisting of Al, Ag, Mg, and Cr.

14. An organic light emissive device according to claim 12, wherein the composite has a thickness in the range of from 3 nm to 20 nm.

15. An organic light emissive device according to claim 1, wherein the composite has a transparency in the device of at least 60%.

16. An organic light emissive device according to claim 1, wherein the other material has a transparency of at least 70% at a thickness of 50 nm.

17. An organic light emissive device according to claim 1, wherein the volume ratio of low work function metal to other material is in the range of from 5 to 80.

18. An organic light emissive device according to claim 1, wherein the at least one electrode further comprises a transparent conductive layer in electrical contact with the side of the composite furthest from the emissive region.

19. An organic light emissive device according to claim 18, wherein the transparent conductive layer is a layer of a transparent conductive oxide.

20. An organic light emissive device according to claim 18, wherein the transparent conductive layer is a layer of a metal.

21. An organic light emissive device according to claim 1, comprising a top-emitting device.

22. An organic light emissive device according to claim 21, wherein the at least one electrode is a cathode and the other electrode is an anode, the anode being reflective or being provided on a substrate comprising a metal minor.

23. An organic light emissive device according to claim 22, wherein the substrate comprises an active matrix back plane.

24. An organic light emissive device according to claim 1, wherein the organic light emissive region comprises subpixels of red, green, and blue light emitting materials, and wherein the at least one electrode injects electrons into each subpixel.

25. An organic light emissive device according to claim 1, wherein the organic light emissive region comprises a light emitting polymer or dendrimer.

26. An organic light emissive device according to claim 1, wherein the other material is evenly mixed in the composite or has a smooth concentration gradient.

27. An organic light emissive device according to claim 1, wherein the other material is a compound of a metal which is more reactive than the charge injecting metal.

28. A process for the manufacture of an organic light emissive device as claimed in claim 1, comprising:
providing the at least one electrode by codepositing (i) a charge injecting metal comprising either a low work function metal having a work function of no more than 3.5 eV or a high work function metal having a work function of no less than 4.5 eV and (ii) a material having a different refractive index to that of the charge injecting metal for reducing quenching of excitons by modes associated with the charge injecting metal to form a transparent composite.

29. An organic light emissive device comprising:
an anode;
a cathode; and
an organic light emissive region between the anode and cathode comprising an organic light emissive material which has a peak emission wavelength, wherein the cathode is transparent and comprises a composite of a low work function metal having a work function of no more than 3.5 eV and another material which is codepositable with the low work function metal, the other material having a different refractive index to that of the low work function metal and wherein the other material has a lower degree of quenching at the peak emission wavelength than the low work function metal whereby quenching of excitons by the cathode is reduced, wherein the volume ratio of low work function metal to other material decreases across the thickness of the cathode in a direction away from the emissive region.

30. An organic light emissive device comprising
a cathode;
an anode; and
an organic light emissive region between the cathode and the anode, wherein the cathode comprises a transparent codeposited mixed layer of calcium or barium and barium fluoride, wherein the volume ratio of calcium or barium to barium fluoride decreases across the thickness of the cathode in a direction away from the emissive region.

31. An organic light emissive device according to claim 30, wherein the mixed layer has a thickness in the range of from 50 nm to 200 nm.

32. An organic light emissive device according to claim 30, wherein the mixed layer has a transparency in the device of at least 60%.

33. An organic light emissive device according to claim 30, wherein the volume ratio of calcium or barium to barium fluoride is in the range of from 5 to 80.

34. An organic light emissive device according to claim 30, wherein the cathode further comprises a transparent conductive layer in electrical contact with the side of the mixed layer furthest from the emissive region.

35. An organic light emissive device according to claim 34, wherein the transparent conductive layer is a layer of a transparent conductive oxide.

36. An organic light emissive device according to claim 30, which is a top-emitting device.

37. An organic light emissive device according to claim 36, wherein the anode is reflective or is provided on a substrate comprising a metal minor.

38. An organic light emissive device according to claim 37, wherein the substrate comprises an active matrix back plane.

39. An organic light emissive device according to claim 30, wherein the organic light emissive region comprises subpixels of red, green, and blue light emitting materials, and wherein the cathode injects electrons into each subpixel.

40. An organic light emissive device according to claim 30, wherein the organic light emissive region comprises a light emitting polymer or dendrimer.

41. A process for the manufacture of an organic light emissive device as defined in claim 30, comprising:
providing a portion of the device which portion comprises an anode and an organic light emissive region; and codepositing (i) calcium or barium and (ii) barium fluoride to form a transparent mixed layer on the organic light emissive region.

42. A process according to claim 41, comprising applying a transparent, conductive layer to the mixed layer by sputtering.

43. An organic light emissive device comprising
a cathode;
an anode; and
an organic light emissive region between the cathode and the anode, wherein the cathode comprises a transparent composite of a low work function metal having a work function of no more than 3.5 eV and a transparent material codepositable with the low work function metal, wherein the volume ratio of low work function metal to transparent material decreases across the thickness of the cathode in a direction away from the emissive region.

44. An organic light emissive device according to claim 43, wherein the low work function metal is an alkaline earth metal.

45. An organic light emissive device according to claim 44, wherein the alkaline earth metal is calcium or barium.

46. An organic light emissive device according to claim 43, wherein the low work function metal is an alkali metal.

47. An organic light emissive device according to claim 46, wherein the alkali metal is lithium.

48. An organic light emissive device according to claim 43, wherein the transparent material comprises a metal compound or Group IV compound.

49. An organic light emissive device according to claim 48, wherein the compound is a halide, oxide, sulfide, nitride, or oxynitride.

50. An organic light emissive device according to claim 49, wherein the metal compound is a fluoride.

51. An organic light emissive device according to claim 48, wherein the metal is barium.

52. An organic light emissive device according to claim 43, wherein the transparent material has a transparency of at least 70% at a thickness of 50 nm.

53. An organic light emissive device comprising
a cathode;
an anode; and
an organic light emissive region between the cathode and the anode, wherein the cathode comprises an electron-injection layer comprising a composite of a metal compound, which is an alkali metal halide, alkali metal oxide, alkaline earth metal halide, or alkaline earth metal oxide, and a low work function metal having a work function of no more than 3.5 eV, wherein the volume ratio of low work function metal to alkali metal halide, alkali metal oxide, alkaline earth metal halide, or alkaline earth metal oxide decreases across the thickness of the cathode in a direction away from the emissive region.

54. An organic light emissive device according to claim 53, wherein the low work function metal is an alkaline earth metal.

55. An organic light emissive device according to claim 53, wherein the low work function metal is calcium or barium.

56. An organic light emissive device according to claim 53, wherein the metal of the metal compound is selected from the group consisting of lithium, sodium, potassium, caesium, rubidium, and barium.

57. An organic light emissive device according to claim 56, wherein the metal of the metal compound is lithium.

58. An organic light emissive device according to claim 53, wherein the metal compound is a fluoride.

59. An organic light emissive device according to claim 53, wherein the volume ratio of low work function metal to metal compound is up to 10:1.

60. An organic light emissive device according to claim 53, wherein the cathode further comprises an electrically conductive capping layer for protecting the electron injection layer from environmental reactants.

61. An organic light emissive device according to claim 60, wherein the electronically conductive capping layer comprises aluminum.

62. An organic light emissive device according to claim 53, wherein the organic light emissive region comprises subpixels of red, green, and blue light emitting materials, and wherein the cathode injects electrons into each subpixel.

63. An organic light emissive device according to claim 53, wherein the organic light emissive region comprises a light emitting polymer or dendrimer.

* * * * *

UNITED STATES PATENT AND TRADEMARK OFFICE
CERTIFICATE OF CORRECTION

| | |
|---|---|
| PATENT NO. | : 8,049,408 B2 |
| APPLICATION NO. | : 11/659930 |
| DATED | : November 1, 2011 |
| INVENTOR(S) | : Euan C. Smith et al. |

It is certified that error appears in the above-identified patent and that said Letters Patent is hereby corrected as shown below:

In the Specification:

At Column 11, line 6, "material," should be -- material --.

Signed and Sealed this
Twentieth Day of August, 2013

Teresa Stanek Rea
*Acting Director of the United States Patent and Trademark Office*